(12) United States Patent
Onishi et al.

(10) Patent No.: US 11,658,618 B2
(45) Date of Patent: *May 23, 2023

(54) DISTORTION COMPENSATION DEVICE, DISTORTION COMPENSATION METHOD, AND NON-TRANSITORY COMPUTER-READABLE STORAGE MEDIUM

(71) Applicant: SUMITOMO ELECTRIC INDUSTRIES, LTD., Osaka (JP)

(72) Inventors: Masahiko Onishi, Osaka (JP); Eiji Mochida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 63 days.

This patent is subject to a terminal disclaimer.

(21) Appl. No.: 17/201,966

(22) Filed: Mar. 15, 2021

(65) Prior Publication Data

US 2021/0305946 A1 Sep. 30, 2021

(30) Foreign Application Priority Data

Mar. 30, 2020 (JP) .............................. JP2020-061017

(51) Int. Cl.
- *H03F 1/32* (2006.01)
- *H03F 3/24* (2006.01)
- *H04B 1/04* (2006.01)
- *H04L 27/36* (2006.01)

(52) U.S. Cl.
CPC ............. *H03F 1/3247* (2013.01); *H03F 3/24* (2013.01); *H04B 1/0475* (2013.01); *H04L 27/368* (2013.01); *H03F 2201/3224* (2013.01); *H04B 2001/0425* (2013.01)

(58) Field of Classification Search
CPC ... H04B 1/0475; H04L 27/368; H03F 1/3247; H03F 3/24; H03F 2201/3224
USPC ........................................... 375/297; 330/149
See application file for complete search history.

(56) References Cited

U.S. PATENT DOCUMENTS

| 9,866,269 B1 * | 1/2018 | Zhao ...................... H03F 1/3252 |
| 2014/0010330 A1 | 1/2014 | Shizawa et al. |

FOREIGN PATENT DOCUMENTS

| JP | 2014-017670 | 1/2014 |
| JP | 2017-220744 | 12/2017 |

* cited by examiner

*Primary Examiner* — Kevin M Burd
(74) *Attorney, Agent, or Firm* — Smith, Gambrell & Russell, LLP.

(57) ABSTRACT

Provided is a distortion compensation device performing distortion compensation on a signal to be amplified by an amplifier, of which an internal state affecting a distortion characteristic varies, using a distortion compensation model, wherein the distortion compensation model includes a plurality of calculation models having respective distortion compensation characteristic for the amplifier in different internal states, and a combiner combining the plurality of calculation models at a combination ratio corresponding to the internal state that varies.

7 Claims, 14 Drawing Sheets

FIG. 4

FIRST CALCULATION MODEL $G_1^{-1}$ HAVING DISTORTION
COMPENSATION CHARACTERISTIC FOR AMPLIFIER IN
FIRST INTERNAL STATE WHERE NO Idq DRIFT IS GENERATED $$G_1^{-1} = \sum_{m=-M_1}^{M_2} \sum_{l=-L_{1,m}}^{L_{2,m}} \sum_{k=0}^{K_{m,l}-1} h_{m,l,k} \cdot |x[n-m-l]|^k \cdot x[n-m] \quad (2)$$

DISTORTION COMPENSATION MODEL $$u[n] = \alpha[n] \cdot G_1^{-1}(x[\cdot]) + (1 - \alpha[n]) \cdot G_2^{-1}(x[\cdot]) \quad (1)$$

$(0 \leq \alpha[n] \leq 1)$: $\alpha[n]$ IS REAL NUMBER OF 0 TO 1

200

SECOND CALCULATION MODEL $G_2^{-1}$ HAVING DISTORTION
COMPENSATION CHARACTERISTIC FOR AMPLIFIER IN
SECOND INTERNAL STATE WHERE Idq DRIFT IS GENERATED $$G_2^{-1} = \sum_{m=-M_3}^{M_4} \sum_{l=-L_{3,m}}^{L_{4,m}} \sum_{k=0}^{Kg_{m,l}-1} g_{m,l,k} \cdot |x[n-m-l]|^k \cdot x[n-m] \quad (3)$$

FIG. 11
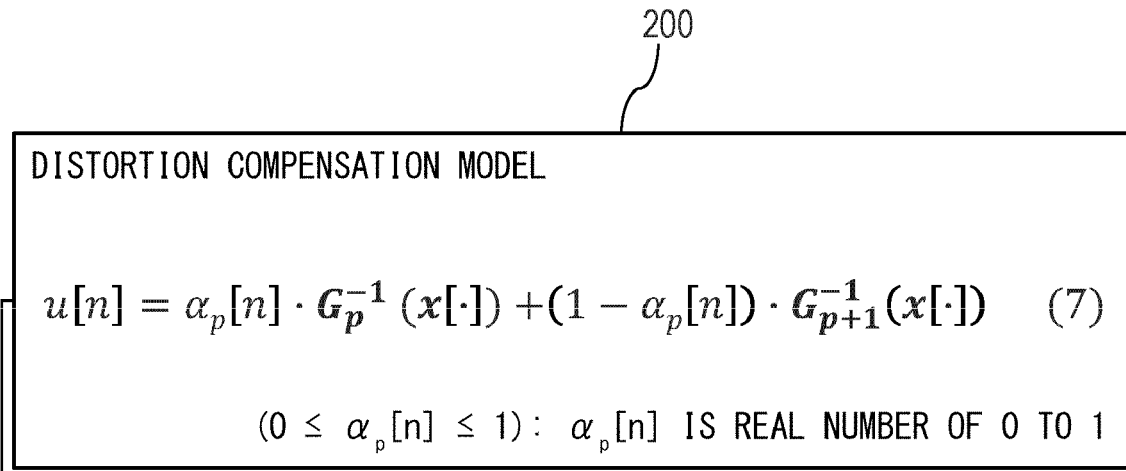
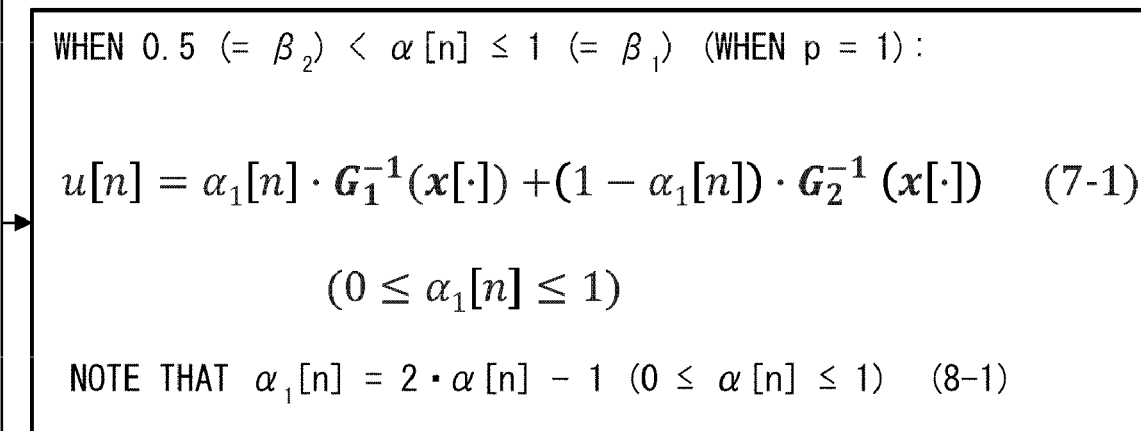
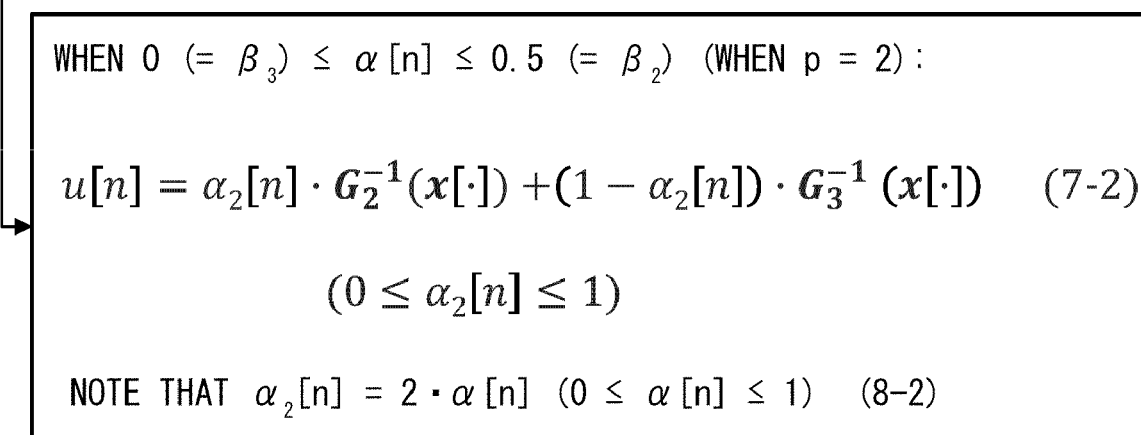

DISTORTION COMPENSATION DEVICE, DISTORTION COMPENSATION METHOD, AND NON-TRANSITORY COMPUTER-READABLE STORAGE MEDIUM

CROSS-REFERENCE TO RELATED APPLICATION

This application is based upon and claims the benefit of priority of the prior Japanese Patent Application No. 2020-061017, filed on Mar. 30, 2020, the entire contents of which are incorporated herein by reference.

BACKGROUND

(i) Technical Field

The present disclosure relates to a distortion compensation device, a distortion compensation method, and a non-transitory computer-readable storage medium.

(ii) Related Art

The amplifier has distortion characteristics. The distortion characteristics are also referred to as non-linear characteristics. The distortion characteristics are represented by, for example, AM-AM characteristics or AM-PM characteristics.

In the amplifier, the internal state affecting the distortion characteristics may vary. The internal state is, for example, the state of generation of the Idq drift, which is a phenomenon that the idle current Idq flowing through the amplifier varies. The generation of the Idq drift varies the distortion characteristics of the amplifier.

The Idq drift is a phenomenon caused by capture of carriers into the impurity level in a semiconductor, and is caused in the device using a compound semiconductor such as GaN, particularly in the high electron mobility transistor (HEMT). The fluctuation of the Idq drift varies the distortion characteristics of the amplifier.

A method for compensating for the distortion characteristics due to the Idq drift is disclosed in Japanese Patent Application Publication Nos. 2017-220744 and 2014-17670 (hereinafter, referred to as Patent Documents 1 and 2, respectively).

SUMMARY

However, in the distortion compensation for the amplifier of which the internal state affecting the distortion characteristics varies, use of the distortion compensation characteristic corresponding to the varying internal state is desired. Although Patent Documents 1 and 2 disclose methods for compensating for the distortion characteristics due to the Idq drift, the method for appropriately expressing the distortion compensation characteristics corresponding to the varying internal state is not disclosed. Therefore, it is impossible to appropriately perform the distortion compensation corresponding to the varying internal state.

Therefore, the distortion compensation using the distortion compensation characteristics corresponding to the varying internal state is desired.

An aspect of the present disclosure is a distortion compensation device. The distortion compensation device of the present disclosure is a distortion compensation device performing distortion compensation on a signal to be amplified by an amplifier, of which an internal state affecting a distortion characteristic varies, using a distortion compensation model, wherein the distortion compensation model includes: a plurality of calculation models having respective distortion compensation characteristics for the amplifier in different internal states, and a combiner combining the plurality of calculation models at a combination ratio corresponding to the internal state that varies.

Another aspect of the present disclosure is a distortion compensation method. The distortion compensation method of the present discloser is a distortion compensation method for performing distortion compensation on a signal to be amplified by an amplifier of which an internal state affecting a distortion characteristic varies, the distortion compensation method including: a step in which a distortion compensation device combines a plurality of calculation models having respective distortion compensation characteristics for the amplifier in different internal states at a combination ratio corresponding to the internal state that varies.

Another aspect of the present disclosure is a computer program. The computer program of the present disclosure is a computer program for distortion compensation on a signal to be amplified by an amplifier of which an internal state affecting a distortion characteristic varies, the computer program causing a computer to execute a process, the process including: combining a plurality of calculation models having respective distortion compensation characteristics for the amplifier in different internal states at a combination ratio corresponding to the internal state that varies.

Another aspect of the present disclosure is a communication device. The communication device of the present disclosure is a communication device including: an amplifier that amplifies a signal for communication; and a distortion compensation device that performs distortion compensation on the signal using a distortion compensation model, wherein the amplifier is configured so that an internal state affecting a distortion characteristic varies, wherein the distortion compensation model includes: a plurality of calculation models having respective distortion compensation characteristics for the amplifier in different internal states, and a combiner combining the plurality of calculation models at a combination ratio corresponding to the internal state that varies.

BRIEF DESCRIPTION OF THE DRAWINGS

FIG. 4 is an explanatory diagram of a distortion compensation model;

FIG. 11 is an explanatory diagram of the distortion compensation model;

DETAILED DESCRIPTION

Figure 1:
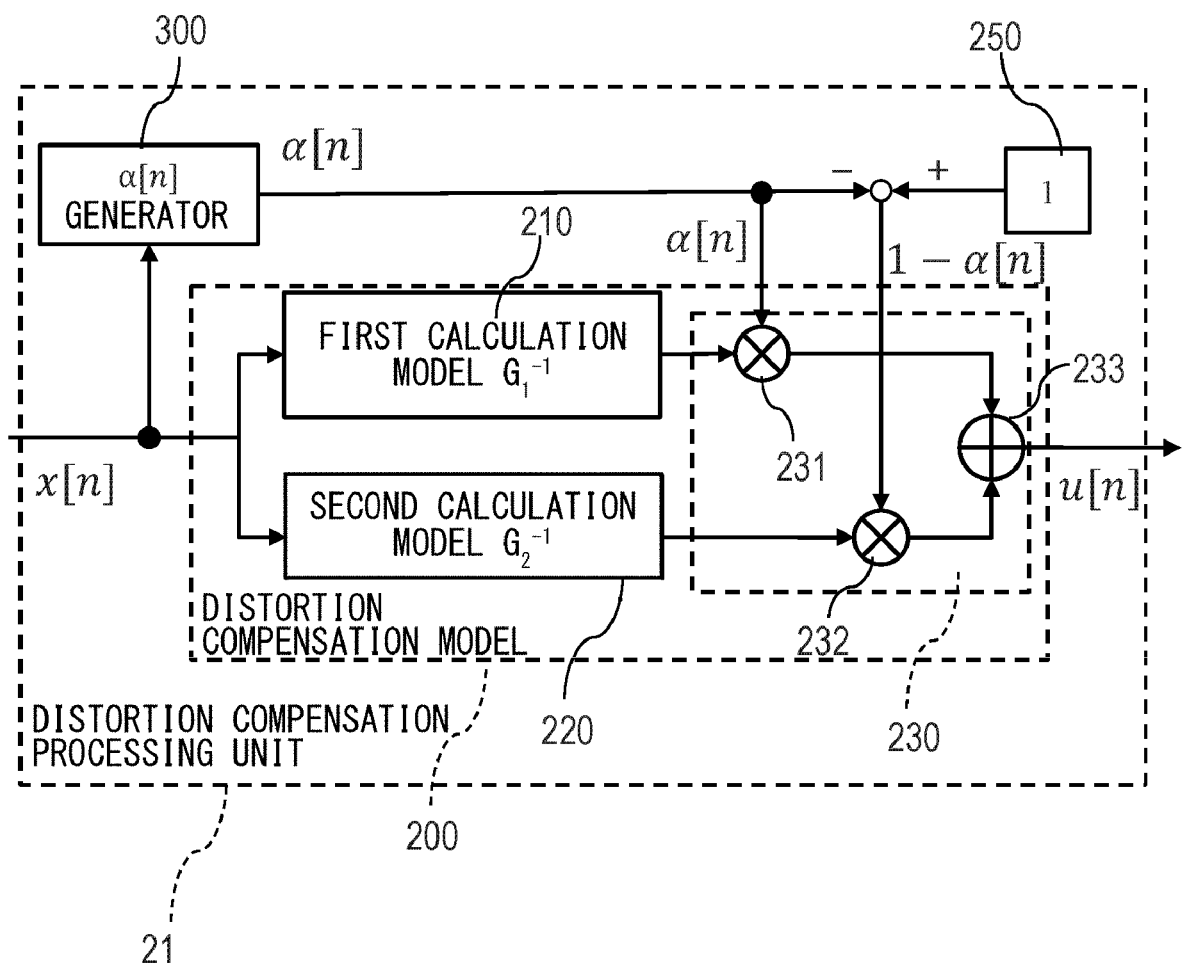
FIG. 1 is a block diagram of a distortion compensation processing unit in a distortion compensation device in accordance with a first embodiment.

Description of Embodiments of the Present Disclosure (1) A distortion compensation device in accordance with an embodiment performs distortion compensation on a signal to be amplified by an the amplifier for the amplifier, of which an internal state affecting a distortion characteristic varies, using a distortion compensation model. The distortion characteristic is also called a non-linear characteristic. The internal state is, for example, a state where the Idq drift is generated. The distortion compensation model includes a plurality of calculation models having respective distortion compensation characteristics for the amplifier in different internal states, and a combiner combining the plurality of calculation models at a combination ratio corresponding to the internal state that varies. The distortion compensation characteristic corresponding to the varying internal state is obtained by combining the plurality of calculation models at the combination ratio corresponding to the varying internal state.

(2) The distortion compensation device may further include a generator generating a parameter indicating the internal state. In this case, the distortion compensation device can generate the parameter indicating the internal state. The generator may be provided in an external device of the distortion compensation device. The generator may be provided in an external device of a communication device described later. The combination ratio may be based on the parameter.

(3) The combination ratio is preferably determined based on a parameter indicating the internal state. The parameter is preferably calculated based on a level of the signal. In this case, the parameter can indicate the internal state that varies depending on the level of the signal to be amplified by the amplifier. Since the combination ratio is determined based on the parameter indicating the internal state, the combination ratio corresponding to the level of the signal to be amplified by the amplifier is obtained.

(4) The parameter is preferably calculated based on a past value of the parameter. The past value of the parameter indicates the past internal state. Thus, the parameter can reflect the past internal state. As a result, the memory effect of the amplifier is reflected to the parameter.

(5) The distortion compensation characteristic of each of the plurality of calculation models preferably has a characteristic for compensating for a first memory effect having a first response time in the amplifier. A parameter calculation model for calculating the parameter preferably expresses a second memory effect having a second response time longer than the first response time in the amplifier. In this case, the second memory effect of the amplifier is reflected to the parameter.

(6) The combination ratio is preferably calculated based on a level of the signal. In this case, the combination ratio corresponding to the level of the signal to be amplified is obtained.

(7) The combination ratio is preferably calculated using a temperature dependent parameter varying depending on a temperature condition. In this case, the variation in the characteristic of the amplifier due to the temperature is supported.

(8) The plurality of calculation models may be two calculation models. In this case, the distortion compensation model becomes simple.

(9) The distortion compensation device may further include a selector. The plurality of calculation models may include three or more calculation models. The selector is preferably configured to select two or more calculation models from among the three or more calculation models. In this case, more appropriate calculation models can be selected.

(10) The selector is preferably configured to select the two or more calculation models based on a parameter indicating the internal state. In this case, appropriate calculation models corresponding to the internal state are selected.

(11) The plurality of calculation models may include: a first calculation model having a first distortion compensation characteristic for the amplifier in a first internal state, and a second calculation model having a second distortion compensation characteristic for the amplifier in a second internal state different from the first internal state. The combination ratio preferably has a value corresponding to a transient internal state between the first internal state and the second internal state. In this case, the distortion compensation model is able to express the distortion compensation characteristic for the amplifier in the transient internal state.

(12) The plurality of calculation models may include: a first calculation model having a first distortion compensation characteristic for the amplifier in a first internal state, a second calculation model having a second distortion compensation characteristic for the amplifier in a second internal state different from the first internal state, and a third calculation model having a third distortion compensation characteristic for the amplifier in a third internal state different from the first internal state and the second internal state. The second internal state is preferably an intermediate internal state between the first internal state and the third internal state. In this case, calculation models corresponding to at least three internal states can be used.

(13) A distortion compensation method in accordance with an embodiment is a distortion compensation method for performing distortion compensation on a signal to be amplified by an amplifier of which an internal state affecting a distortion characteristic varies, the distortion compensation method including: a step in which a distortion compensation device combines a plurality of calculation models having respective distortion compensation characteristics for the amplifier in different internal states at a combination ratio corresponding to the internal state that varies.

(14) A computer program in accordance with an embodiment is a computer program for distortion compensation on a signal to be amplified by an amplifier of which an internal state affecting a distortion characteristic varies, the computer program causing a computer to execute a process, the process including: combining a plurality of calculation models having respective distortion compensation characteristics for the amplifier in different internal states at a combination ratio corresponding to the internal state that varies. A computer program is stored in a non-transitory computer-readable storage medium.

(15) A communication device in accordance with an embodiment includes: an amplifier that amplifies a signal for communication; and a distortion compensation device that performs distortion compensation on the signal using a distortion compensation model, wherein the amplifier is configured so that an internal state affecting a distortion characteristic varies, wherein the distortion compensation model includes: a plurality of calculation models having respective distortion compensation characteristics for the amplifier in different internal states, and a combiner combining the plurality of calculation models at a combination ratio corresponding to the internal state that varies.

DETAILS OF EMBODIMENTS OF THE PRESENT DISCLOSURE

First Embodiment

Figure 2:
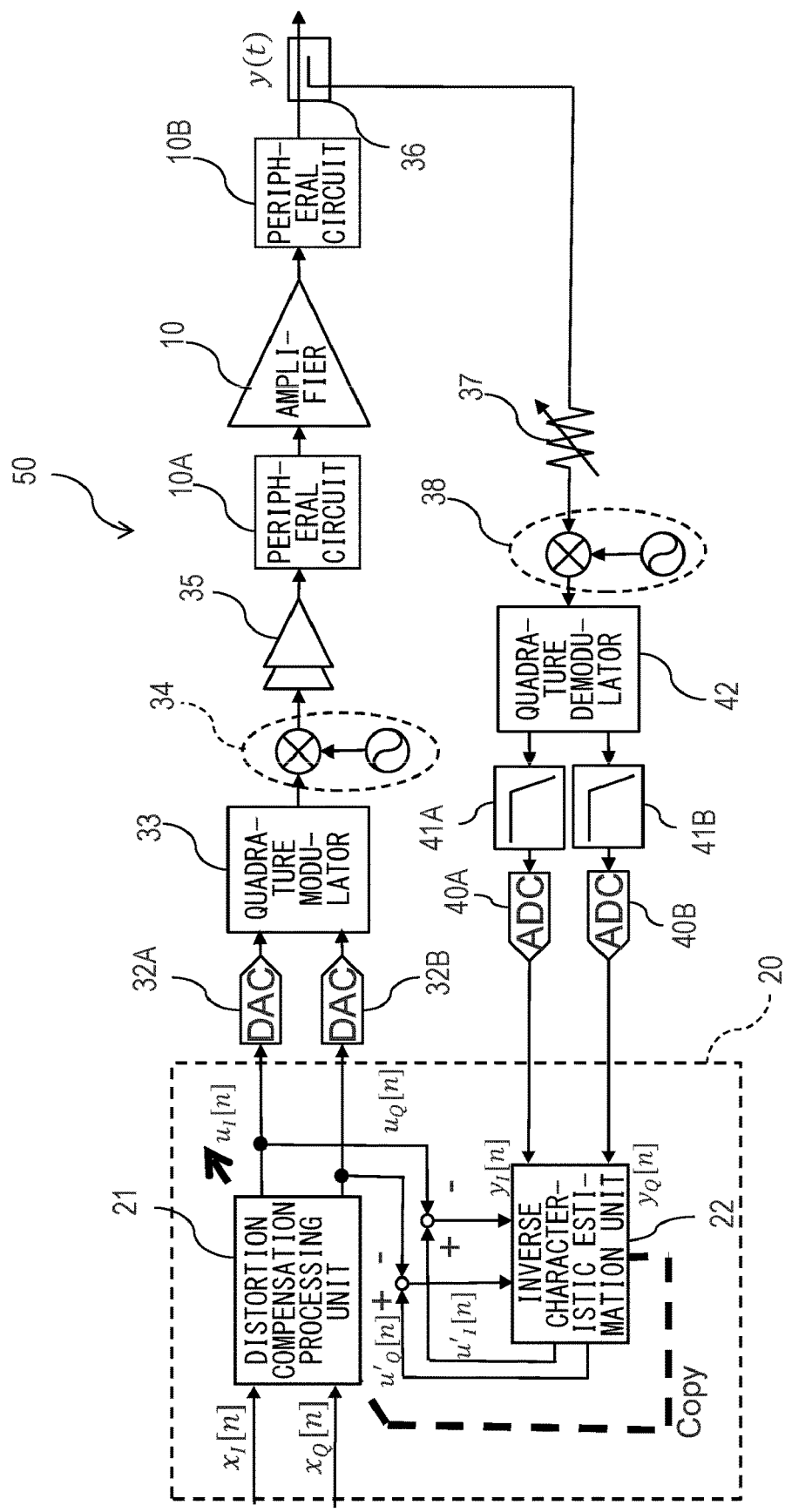
FIG. 2 is a configuration diagram of a communication device.

FIG. 1 and FIG. 2 illustrate a distortion compensation device 20 in accordance with a first embodiment. FIG. 2 also illustrates a configuration of a communication device 50 including the distortion compensation device 20. The distortion compensation device 20 performs distortion compensation on a signal to be amplified by an amplifier 10.

The amplifier 10 is, for example, a power amplifier. The amplifier 10 is, for example, a gallium nitride (GaN)-HEMT. The amplifier 10 is not limited to a GaN amplifier, and may be an HEMT device using a compound semiconductor such as aluminum nitride (AlN) or indium nitride (InN), or AlGaN, InAlN, or InGaN, which is a mixed crystal of AlN or InN.

The amplifier 10 using the compound semiconductor such as GaN has a transient response called the Idq drift. The Idq drift is a phenomenon that as carriers are trapped into the impurity level in the semiconductor, the idle current Idq decreases and the distortion characteristics thereby vary.

In the device in which the Idq drift is caused, the distortion instantaneously varies according to the electric power fluctuation of the signal. The electric power fluctuation of the signal is likely to occur particularly in communication systems that alternately perform transmission and reception such as Time Division Duplex (TDD). In the amplifier in which the Idq drift is generated, since the distortion characteristics vary, it is difficult to compensate for the distortion using a single distortion compensation model.

The likelihood of generation of the Idq drift varies depending on the input power (the input signal level) and the extent of generation of the drift. As the input power increases, the drift is more likely to occur. In the state where the Idq drift is generated, the gain decreases in the region where the input power is small. By contrast, as the input power decreases, the decreased idle current Idq starts to recover, and the gain recovers as time passes.

In general, the amplifier 10 has distortion called memory effect. The memory effect is a phenomenon that the output signal of the amplifier is affected by the past input signal. The memory effect may include memory effect having a short response time (first memory effect having a first response time; short-term memory effect) and memory effect having a long response time (second memory effect having a second response time longer than the first response time; long-term memory effect). Here, the response time is the response time of the output to the change in input, and the response time is also called a time constant.

The characteristic fluctuation due to the Idq drift represents the state of the second memory effect having a long response time. It is relatively easy to construct the amplifier model that expresses only the first memory effect having a short response time, but it is not easy to construct a single amplifier model that expresses the second memory effect having a long response time in addition to the first memory effect having a short response time. Particularly, when the degree of influence of the second memory effect varies depending on the internal state of the amplifier such as the extent of the decrease in Idq, modeling becomes more difficult.

Thus, the present embodiment uses a distortion compensation model 200 that is able to express distortion compensation characteristic appropriately according to the variation in the internal state (the state of the second memory effect) such as the state of generation of the Idq drift.

Hereinafter, the signal is expressed mainly by discrete values *[n] handled in a digital circuit. Here, *[n] is a complex baseband IQ signal sampled at time n×T in a system having a sampling interval T [sec].

For example, x[n] is an input signal before distortion compensation, and is expressed by $x[n]=x_I[n]+j\times x_Q[n]$. Here, $x_I[n]$ is the real part (I-channel) of x[n], and $x_Q[n]$ is the imaginary part (Q-channel) of x[n]. By contrast, u[n] is an input signal after distortion compensation, and is expressed by $u[n]=u_I[n]+j\times u_Q[n]$. Here, $u_I[n]$ is the real part (I-channel) of u[n], and $u_Q[n]$ is the imaginary part (Q-channel) of u[n]. Additionally, y[n] is an output signal, and is expressed by $y[n]=y_I[n]+j\times y_Q[n]$. Here, $y_I[n]$ is the real part (I-channel) of y[n], and $y_Q[n]$ is the imaginary part (Q-channel) of y[n].

The amplifier 10 is used in, for example, the communication device 50 illustrated in FIG. 2. The amplifier 10 is, for example, a power amplifier that amplifies a signal transmitted from the communication device 50.

Figure 3:
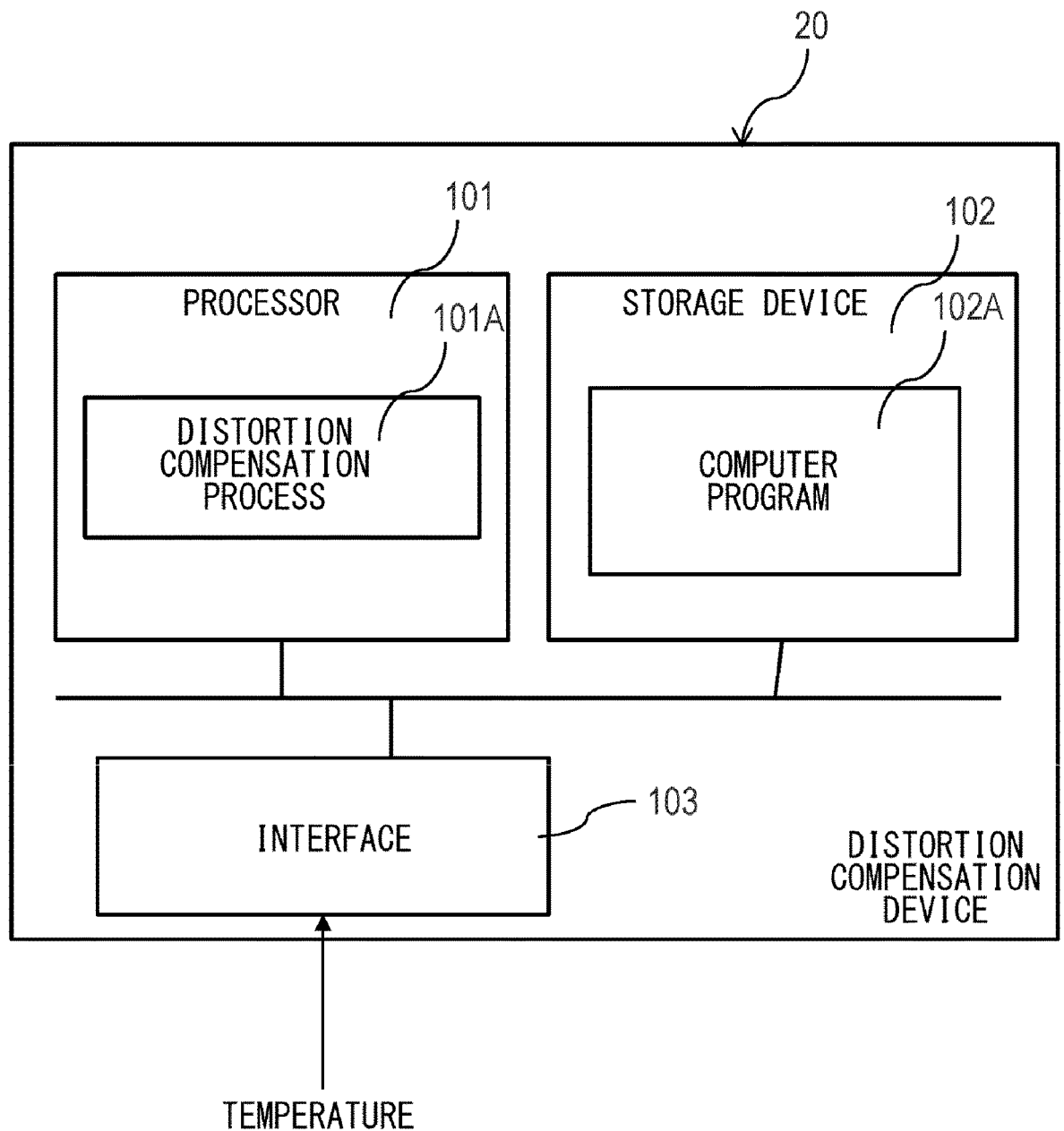
FIG. 3 is a hardware configuration diagram of the distortion compensation device.

The communication device 50 includes the distortion compensation device 20. The distortion compensation device 20 performs distortion compensation using digital signal processing. As illustrated in FIG. 3, the distortion compensation device 20 is constructed of a computer including a processor 101 and a storage device 102. The processor 101 is coupled to the storage device 102. The processor 101 is, for example, a central processing unit (CPU). The storage device 102 includes, for example, a primary storage device and a secondary storage device. The primary storage device is, for example, a random access memory (RAM). The secondary storage device is, for example, a hard disk drive (HDD) or a solid state drive (SSD). The distortion compensation device 20 may be constructed of a wired logic circuit.

The storage device 102 stores a computer program 102A that causes the computer to operate as the distortion compensation device 20. The computer program 102A is configured to cause the processor 101 to execute a distortion compensation process 101A. The computer executing the distortion compensation process 101A operates as the distortion compensation device 20 (a distortion compensation processing unit 21 and an inverse characteristic estimation unit 22) illustrated in FIG. 2.

The processor 101 reads the computer program 102A from the storage device 102 and executes the computer program 102A. The computer program 102A has a code that causes the computer to operate as the distortion compensation model 200 and the generator 300 illustrated in FIG. 1.

The computer operating as the distortion compensation device 20 includes an interface 103. The interface 103 includes at least one interface selected from a group consisting of a communication interface for communicating with other computers, an input interface for connecting to an input device such as a keyboard or a mouse, and an output interface for connecting to an output device such as a display.

Data such as the temperature of the amplifier 10 are input to the distortion compensation device 20 through the interface 103.

As illustrated in FIG. 2, the distortion compensation device 20 includes the distortion compensation processing unit 21 and the inverse characteristic estimation unit 22. The inverse characteristic estimation unit 22 estimates an inverse model (a distortion compensation model) representing a distortion compensation characteristic. The inverse model is configured as, for example, a distortion compensation function. The inverse model (the distortion compensation function) indicates the inverse characteristic $G^{-1}$ of the amplification characteristic G of the amplifier 10. The inverse model indicating the inverse characteristic $G^{-1}$ can be obtained as, for example, the inverse function of the function indicating the characteristic G of the amplifier 10. The inverse characteristic estimation unit 22 copies the estimated inverse model to the distortion compensation processing unit 21. The inverse model to be copied is specifically a parameter expressing the inverse model, more specifically a distortion compensation coefficient constituting the distortion compensation function.

The distortion compensation processing unit 21 performs the predistortion compensation process on the input signal $x[n]=x_I[n]+j\times x_Q[n]$ using the inverse model copied from the inverse characteristic estimation unit 22. The predistortion compensation process is a process applying the distortion compensation function to the input signal $x[n]$. Then, the distortion compensation processing unit 21 outputs the signal $u[n]=u_I[n]+j\times u_Q[n]$ generated through the predistortion compensation process. Hereinafter, the signal generated through the predistortion compensation process may be referred to as a "compensated signal". Here, the input signal $x[n]$ and the compensated signal $u[n]$ are digital signals.

The communication device 50 further includes DA converters (DACs) 32A and 32B, a quadrature modulator 33, a frequency converter 34, and a drive amplifier 35.

The DACs 32A and 32B convert the signal $u[n]$ from a digital signal to an analog signal. The quadrature modulator 33 outputs a modulation signal obtained by performing quadrature modulation on the analog compensated signals (the analog IQ baseband signals) output from the DACs 32A and 32B. The frequency converter 34 is an upconverter, and up-converts the modulation signal output from the quadrature modulator 33. The drive amplifier 35 amplifies the up-converted modulation signal.

The signal output from the drive amplifier 35 is provided to the amplifier 10 as the input signal to the amplifier 10. The amplifier 10 outputs the output signal $y(t)$ obtained by amplifying the input signal $u(t)$. A peripheral circuit 10A is provided in the prior stage of the amplifier 10, and a peripheral circuit 10B is provided in the posterior stage of the amplifier 10. Each of the peripheral circuits 10A and 10B includes an electronic circuit element such as a resistor or a capacitor.

The communication device 50 further includes a coupler 36, a variable attenuator 37, a quadrature demodulator 42, filters 41A and 41B, and AD converters (ADCs) 40A and 40B.

The coupler 36 outputs an analog monitoring signal obtained by monitoring the output signal $y(t)$ of the amplifier 10. A frequency converter 38 is a down-converter, and down-converts the analog monitoring signal provided from the coupler 36 through the variable attenuator 37. The quadrature demodulator 42 performs quadrature demodulation on the analog monitoring signal output from the frequency converter 38.

The filters 41A and 41B are a low-pass filter or a bandpass filter. The demodulation signals output from the quadrature demodulator 42 pass through the filters 41A and 41B to be provided to the ADCs 40A and 40B. The ADCs 40A and 40B convert the demodulation signals provided from the quadrature demodulator 42 from the analog signal to the digital signal. The ADCs 40A and 40B provide a digital demodulation signal $y[n]=y_I[n]+j\times y_Q[n]$ corresponding to the output signal $y(t)$ of the amplifier 10 to the inverse characteristic estimation unit 22.

The inverse characteristic estimation unit 22 obtains the replica signal $u'[n]=u'_I[n]+j\times u'_Q[n]$ of the distortion compensation signal $u[n]=u_I[n]+j\times u_Q[n]$ from the digital demodulation signal $y[n]=y_I[n]+j\times y_Q[n]$ corresponding to the output signal $y(t)$ of the amplifier 10 using the estimated inverse characteristic $G^{-1}$.

The inverse characteristic estimation unit 22 obtains an error signal $(u'_I[n]-u_I[n], u'_Q[n]-u_Q[n])$ indicating the difference between the distortion compensation signal $u[n]=u_I[n]+j\times u_Q[n]$ and the replica signal $u'[n]=u'_I[n]+j\times u'_Q[n]$ of the distortion compensation signal. The inverse characteristic estimation unit 22 successively updates the parameter (the distortion compensation coefficient; the distortion compensation model) constituting the inverse characteristic $G^{-1}$, which is to be the distortion compensation characteristic, so that the error signal becomes small. The updated distortion compensation coefficient (the distortion compensation model) is copied to the distortion compensation processing unit 21.

With reference back to FIG. 1, the distortion compensation processing unit 21 of the distortion compensation device 20 in accordance with the embodiment includes the distortion compensation model 200. The distortion compensation model 200 has the inverse characteristic $G^{-1}$ to be the distortion compensation characteristic. The distortion compensation model 200 includes a plurality of calculation models $G_1^{-1}$ and $G_2^{-1}$. As an example, the number of the calculation models $G_1^{-1}$ and $G_2^{-1}$ included in the distortion compensation model 200 illustrated in FIG. 1 is two. That is, the distortion compensation model 200 includes a first calculation model $G_1^{-1}$ and a second calculation model $G_2^{-1}$. The distortion compensation characteristic $G^{-1}$ of the distortion compensation model 200 is represented as the composite characteristic of the calculation models $G_1^{-1}$ and $G_2^{-1}$. Each of the calculation models $G_1^{-1}$ and $G_2^{-1}$ is represented by, for example, a function. The number of calculation models may be three or more, and the distortion compensation characteristic $G^{-1}$ in the distortion compensation model 200 may be represented as the composite characteristic of three or more calculation models.

In the embodiment, the calculation for the first calculation model $G_1^{-1}$ is performed by a first arithmetic unit 210. The first arithmetic unit 210 applies the first calculation model $G_1^{-1}$ to the input signal $x[n]$, and outputs the calculation result $G_1^{-1}(x[\cdot])$. The calculation for the second calculation model $G_2^{-1}$ is performed by a second arithmetic unit 220. The second arithmetic unit 220 applies the second calculation model $G_2^{-1}$ to the input signal $x[n]$, and outputs the calculation result $G_2^{-1}(x[\cdot])$.

The distortion compensation model 200 further includes a combiner 230. The combiner 230 includes multipliers 231 and 232, and an adder 233. The combiner 230 obtains the composite characteristic obtained by combining the calculation models $G_1^{-1}$ and $G_2^{-1}$ at a combination ratio that dynamically varies. The composite characteristic of the calculation models $G_1^{-1}$ and $G_2^{-1}$ is the distortion compensation characteristic $G^{-1}$ of the distortion compensation model 200. The distortion compensation characteristic $G^{-1}$ varies according to the variation in the combination ratio.

In the embodiment, the combiner 230 combines the calculation result $G_1^{-1}$ (x[·]) of the first arithmetic unit 210 and the calculation result $G_2^{-1}$ (x[·]) of the second arithmetic unit 220 at the varying combination ratio. A composite function may be obtained by combining the coefficients of the functions constituting the calculation models $G_1^{-1}$ and $G_2^{-1}$ at the combination ratio, and the obtained composite function may be applied to the input signal x[n].

The distortion compensation device 20 includes a generator 300 for generating a parameter α[n] used to determine the combination ratio dynamically varying. In the embodiment, the generator 300 generates the parameter α[n] based on the input signal u[n]. Here, α[n] is a real number ranging from 0 to 1, as an example. The distortion compensation model 200 obtains the parameter α[n] from the generator 300. The generator 300 may be provided to an external device of the distortion compensation device 20. In this case, the distortion compensation device 20 obtains α[n] generated by the external generator 300, and provides the obtained α[n] to the distortion compensation model 200.

In the embodiment, the combination ratio that dynamically varies is represented by α[n]:1−α[n]. Thus, when the parameter α[n] is dynamically determined, the combination ratio is automatically determined. Here, α[n] indicates the ratio (the weight) for the first calculation model $G_1^{-1}$, and the multiplier 231 multiplies the first calculation model $G_1^{-1}$ by α[n] (see FIG. 1 and FIG. 4). Additionally, 1−α[n] indicates the ratio (the weight) for the second calculation model $G_2^{-1}$, and the multiplier 232 multiplies the second calculation model $G_2^{-1}$ by 1−α[n] (see FIG. 1 and FIG. 4). The distortion compensation device 20 includes a constant generator 250 for generating "1" in 1−α[n].

The adder 233 adds up the outputs of the multipliers 231 and 232. The result of the addition by the adder 233 represents the calculation result (the distortion compensation signal u[n]) by the distortion compensation model 200.

The distortion compensation model 200 in accordance with the embodiment is represented by the equation (1) presented in FIG. 4. The equation (1) is equivalent to the distortion compensation model 200 presented in FIG. 1. Also in FIG. 4, the distortion compensation model 200 in accordance with the embodiment is represented as the model obtained by combining the calculation models $G_1^{-1}$ and $G_2^{-1}$ at the combination ratio determined by α[n].

The calculation models $G_1^{-1}$ and $G_2^{-1}$ have distortion compensation characteristics for the amplifier 10 in different internal states, respectively. More specifically, the first calculation model $G_1^{-1}$ has a distortion compensation characteristic for the amplifier 10 in a first internal state, and the second calculation model $G_2^{-1}$ has a distortion compensation characteristic for the amplifier 10 in the second internal state. The first internal state differs from the second internal state.

The internal state is not particularly limited as long as it is the state of the amplifier affecting the distortion characteristics of the amplifier 10. As an example, the internal state is based on the value of the idle current Idq flowing through the amplifier 10. The Idq varies depending on the magnitude of the input power (the input signal level). In the embodiment, the internal state parameter α[n] closer to 0 indicates larger decrease in Idq, and the internal state parameter α[n] closer to 1 indicates smaller decrease in Idq.

Figure 5:
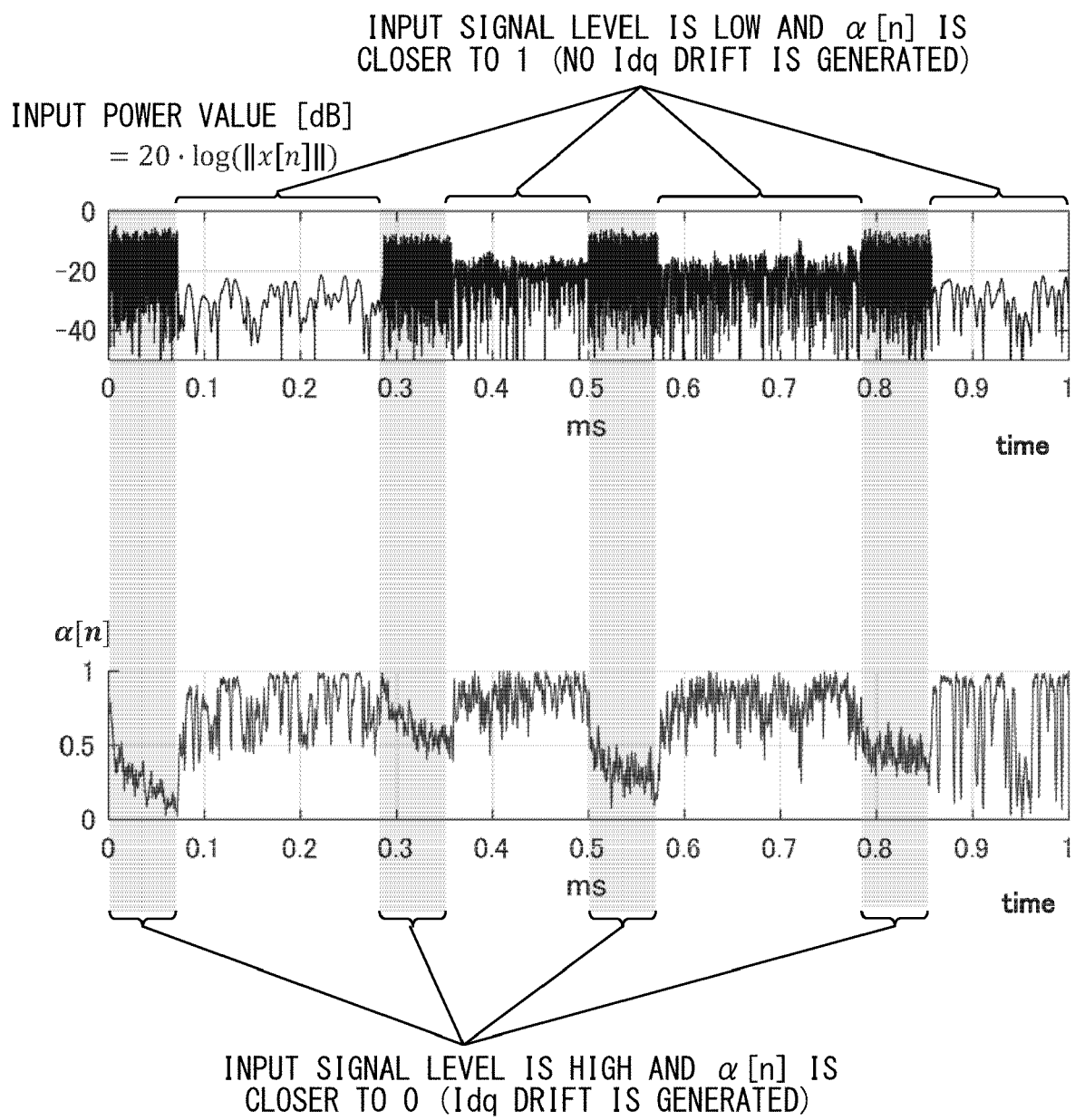
FIG. 5 illustrates a relation between an input power and an internal state parameter.

FIG. 5 illustrates a relation between the input power value and the internal state parameter α[n] based on the state of generation of the Idq drift. As illustrated in FIG. 5, when a large input power is input to the amplifier 10, the Idq drift is generated, and α[n] becomes closer to 0. By contrast, as the input power decreases, the Idq drift is generated less, and α[n] becomes closer to 1. As seen above, the internal state parameter α[n] varies depending on the input power value.

In the embodiment, different calculation models $G_1^{-1}$ and $G_2^{-1}$ corresponding to states of generation of the Idq drift are prepared. The distortion compensation model 200 for the amplifier 10 in an arbitrary state of generation of the Idq drift is obtained by combining the calculation models $G_1^{-1}$ and $G_2^{-1}$ according to the varying g state of the Idq drift (the internal state). In the embodiment, the combining of the calculation models $G_1^{-1}$ and $G_2^{-1}$ is linear combination of the calculation models $G_1^{-1}$ and $G_2^{-1}$ (see the equation (1) in FIG. 4).

The first internal state corresponding to the first calculation model $G_1^{-1}$ indicates the state where no Idq drift is generated in the amplifier 10. As presented in FIG. 6, the first internal state is the state where the internal state parameter α[n]=1. As presented in FIG. 7, the coefficient constituting the first calculation model $G_1^{-1}$ is determined based on the input signal and the output signal of the amplifier 10 in the state S1 where no Idq drift is generated.

Figure 6:
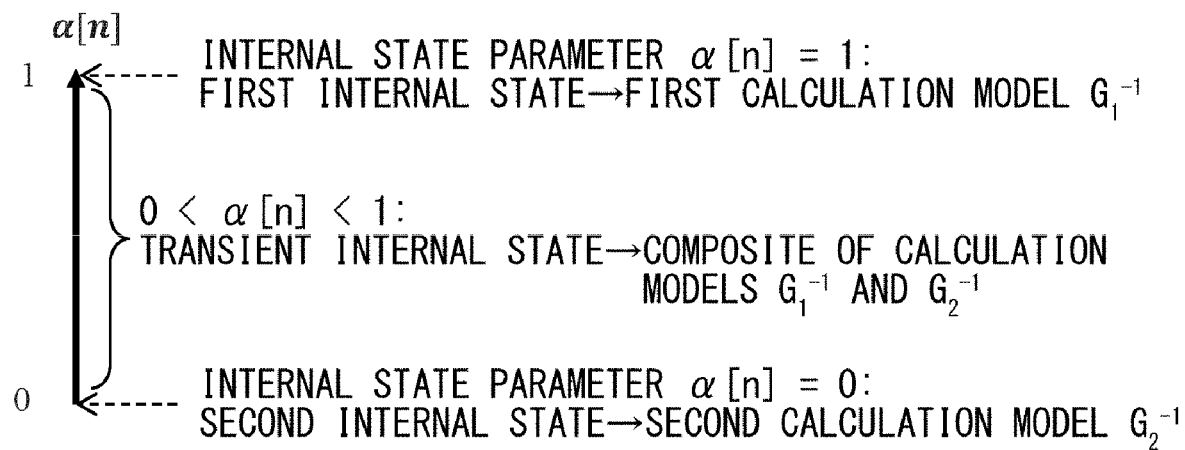
FIG. 6 illustrates a relation between the internal state parameter and a calculation model.
Figure 7:
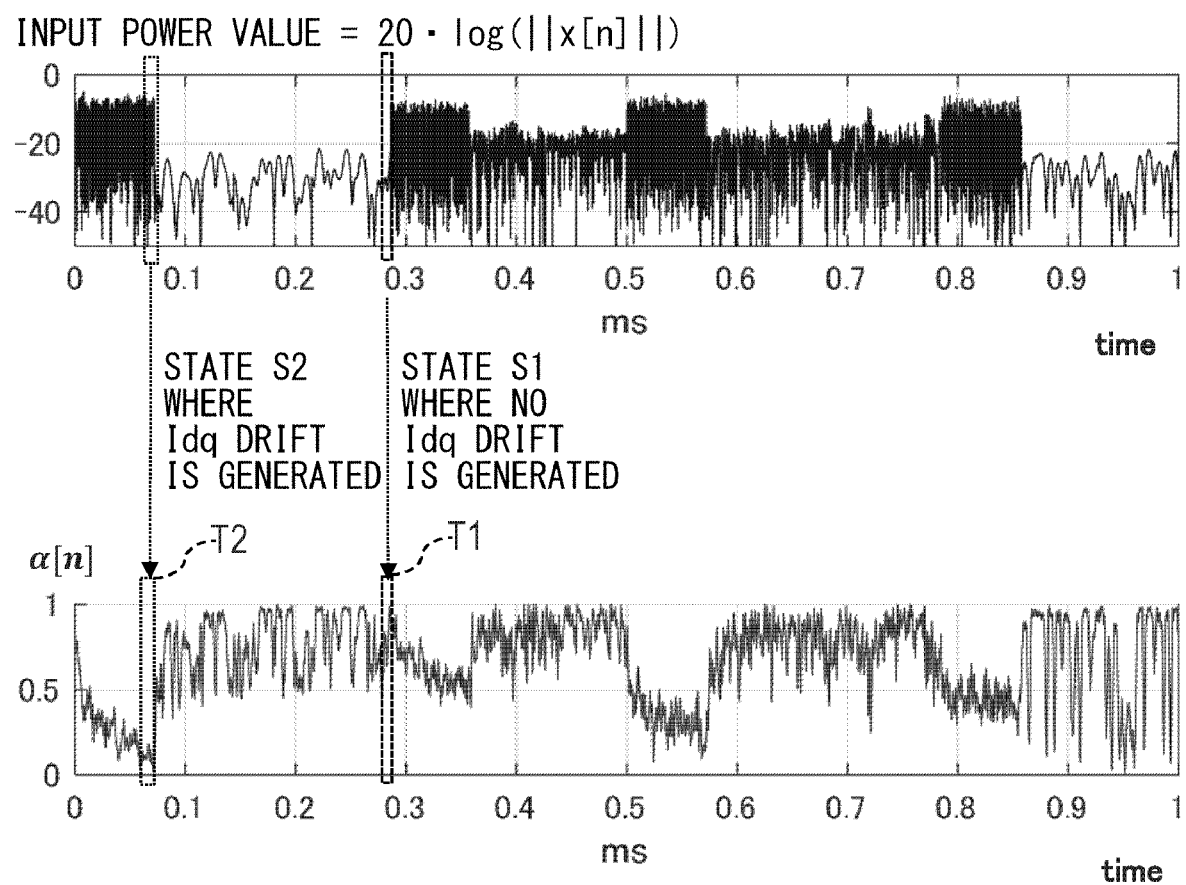
FIG. 7 is an explanatory diagram for generating a calculation model.

The second internal state corresponding to the second calculation model $G_2^{-1}$ indicates the state where the Idq drift is generated more than in the first internal state in the amplifier 10. As illustrated in FIG. 6, the second internal state is a state where the internal state parameter α[n]=0. As illustrated in FIG. 7, the coefficient constituting the second calculation model $G_2^{-1}$ is determined based on the input signal and the output signal of the amplifier 10 in the state S2 where the Idq drift is generated.

Figure 8:
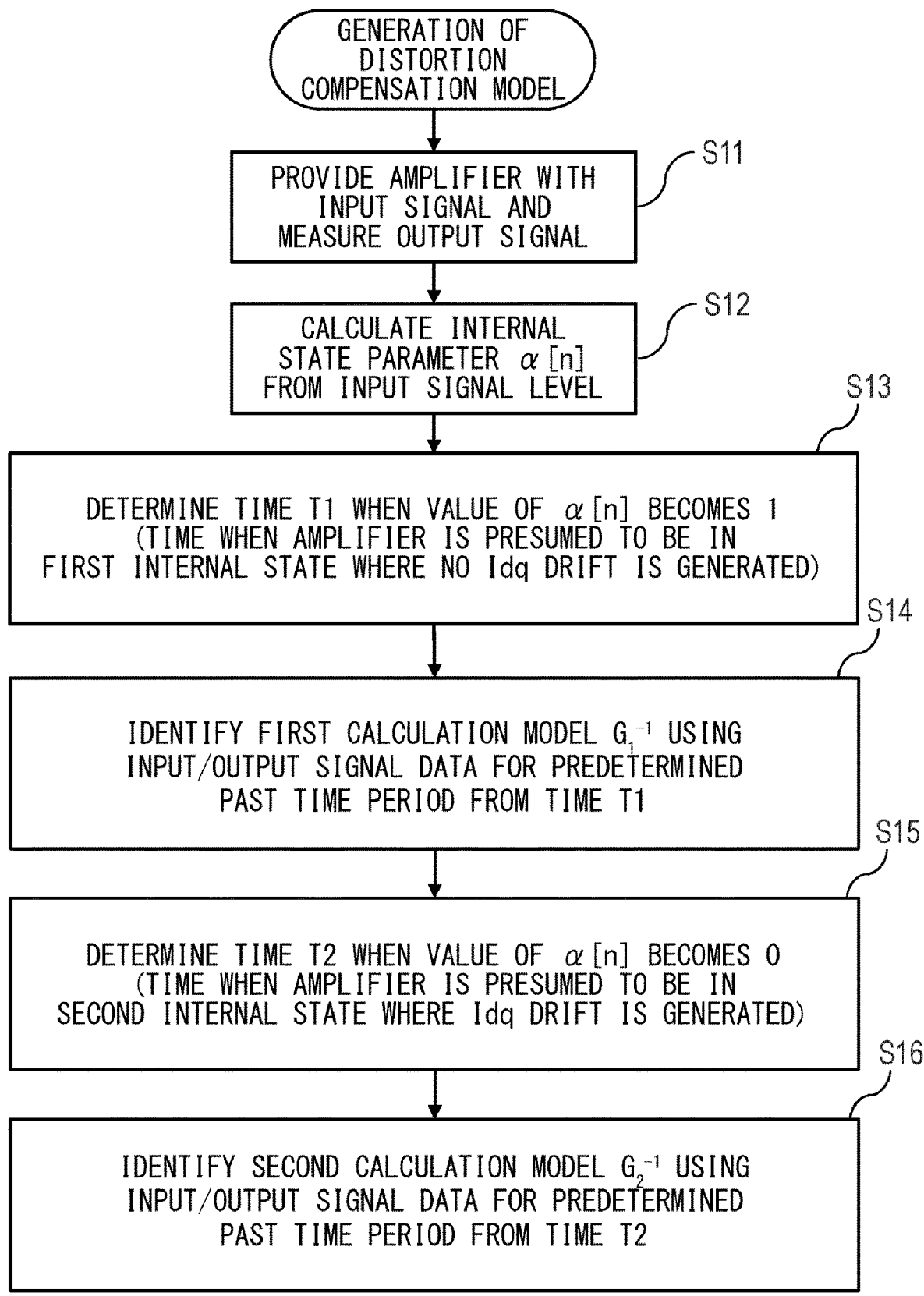
FIG. 8 is a flowchart of a process of generating a distortion compensation model.

FIG. 8 illustrates a process of generating the calculation models $G_1^{-1}$ and $G_2^{-1}$ constituting the distortion compensation model 200. First, an input signal is provided to the amplifier 10, and the output signal is measured (step S11). The input signal is, for example, a communication signal transmitted by the communication device 50. Through the measurement in step S11, a data pair of the input signal and the output signal of the amplifier 10 is obtained.

In step S12, the internal state parameter α[n] is calculated from the input signal level provided to the amplifier 10. The internal state parameter α[n] is calculated based on the level of the input signal x[n] by the α[n] generator 300.

In step S13, the time T1 (see FIG. 7) when the value of α[n] becomes 1 is determined. The time T1 is the time when the amplifier 10 is presumed to be in the first internal state where no Idq drift is generated.

In step S14, the coefficient $h_{m,l,k}$ of the first calculation model $G_1^{-1}$ is identified from the data of the input signal and the output signal for a predetermined past time period from the time T1. Through this process, the first calculation model $G_1^{-1}$ is obtained.

In step S15, the time T2 (see FIG. 7) when the value of α[n] becomes 0 is determined. The time T2 is the time when the amplifier 10 is presumed to be in the second internal state where the Idq drift is generated.

In step S16, the coefficient $g_{m,l,k}$ of the second calculation model $G_2^{-1}$ is identified from the data of the input signal and the output signal for a predetermined past time period from the time T2. Through this process, the second calculation model $G_2^{-1}$ is obtained.

Each of the calculation models $G_1^{-1}$ and $G_2^{-1}$ is an equation representing the distortion compensation characteristic for compensating for the non-liner characteristic (the distortion characteristic) of the amplifier 10. Typical expression forms for modeling the non-linear characteristic can be employed as the expression form of the calculation models $G_1^{-1}$ and $G_2^{-1}$. The expression form of the calculation model is, for example, the generalized memory polynomial, the Winer-Hammerstein model, the Sarah model, or the Volterra series. The calculation models $G_1^{-1}$ and $G_2^{-1}$ presented in FIG. 4 are expressed by the generalized memory polynomial. The conventional model such as the generalized memory polynomial, the Winer-Hammerstein model, the Sarah model, or the Volterra series can express distortion compensation characteristic for the amplifier in a certain internal state, but is unable to appropriately express the distortion compensation characteristic in the case where the non-linear characteristic (the distortion characteristic) varies according to the variation in the internal state of the amplifier.

In the first calculation model $G_1^{-1}$ (see the equation (2)) presented in FIG. 4, $h_{m,l,k}$ is the coefficient expressing the first calculation model $G_1^{-1}$, and the input signal $x[\cdot]$ is multiplied by $h_{m,l,k}$. The values of $M_1$ and $M_2$ defining the range of m and the values of $L_{1,m}$ and $L_{2,m}$ defining the range of l are set according to the length of the first response time (the short response time) of the first memory effect (the short-term memory effect). That is, the first calculation model $G_1^{-1}$ compensates for the first memory effect having the first response time that is short.

In the second calculation model $G_2^{-1}$ (see the equation (3)) presented in FIG. 4, $g_{m,l,k}$ is the coefficient expressing the second calculation model $G_2^{-1}$, and the input signal $x[\cdot]$ is multiplied by $g_{m,l,k}$. The values of $M_3$ and $M_4$ defining the range of m and the values of $L_{3,m}$ and $L_{4,m}$ defining the range of l are set according the length of the first response time (the short response time) of the first memory effect (the short-term memory effect). That is, the second calculation model $G_2^{-1}$ compensates for the first memory effect having the first response time that is short. The first response time in the first calculation model $G_1^{-1}$ is not necessarily identical to the first response time in the second calculation model $G_2^{-1}$.

The first calculation model $G_1^{-1}$ represents the distortion compensation characteristic for the amplifier 10 in the first internal state ($\alpha[n]=1$), while the second calculation model $G_2^{-1}$ represents the distortion compensation characteristic for the amplifier 10 in the second internal state ($\alpha[n]=0$). However, neither the calculation model $G_1^{-1}$ nor $G_2^{-1}$ appropriately represents the distortion compensation characteristic for the amplifier 10 in an arbitrary transient internal state between the first internal state and the second internal state ($0<\alpha[n]<1$).

Therefore, in the embodiment, the calculation models $G_1^{-1}$ and $G_2^{-1}$ are combined according to the combination ratio corresponding to an arbitrary transient internal state. The distortion compensation model 200 obtained by combining can represent the distortion compensation characteristic for the amplifier 10 in the transient internal state. The combination ratio corresponding to the internal state outside the range between the first internal state and the second internal state can be obtained using the extrapolation method. In the embodiment, the combination ratio is calculated based on the level of the input signal $x[n]$ (see FIG. 1).

The combination ratio of the calculation models $G_1^{-1}$ and $G_2^{-1}$ may have the value corresponding to an arbitrary transient internal state between the first internal state and the second internal state ($0<\alpha[n]<1$). In the transient internal state, the state of generation of the Idq drift is between the state of generation of the Idq drift in the first internal state and the state of generation of the Idq drift in the second internal state.

Figure 9:
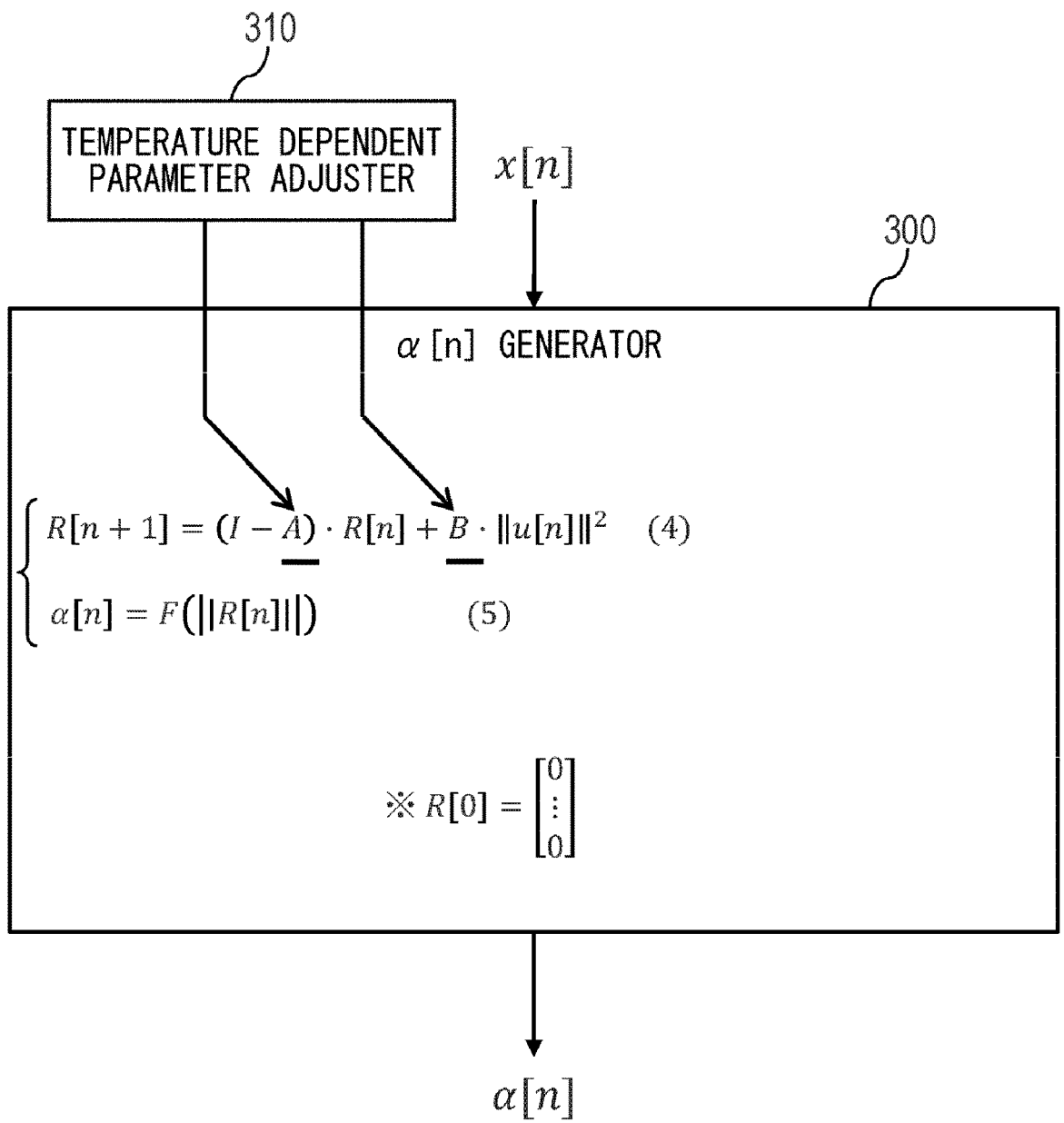
FIG. 9 is an explanatory diagram of an α[n] generator.

FIG. 9 illustrates the $\alpha[n]$ generator 300. The $\alpha[n]$ generator 300 calculates a first parameter $R[n]$ and a second parameter $\alpha[n]$ indicating the internal state, and outputs a second parameter $\alpha[n]$ used to determine the combination ratio. The first parameter $R[n]$ indicating the internal state expresses the state of the Idq drift.

The first parameter $R[n]$ is calculated according to the equation (4) in FIG. 9. The equation (4) constitutes the parameter calculation model for calculating the parameter $R[m]$. As presented in the equation (4), the first parameter $R[n+1]$ at n+1 is calculated based on the level of the input signal $x[n]$ at n. More specifically, the first parameter $R[n+1]$ is calculated based on the past value (the previous value) $R[n]$ of the parameter and the input signal $x[n]$.

In the equation (4), $R[n]$ and $R[n+1]$ are m×1 scalar matrices. I is an m×m unit matrix. A is an m×m scalar matrix. B is an m×m scalar matrix, and is a coefficient matrix by which the input signal $x[n]$ is to be multiplied. Here, m is a positive integer, and the same applies the description hereinafter. As m is increased, the state of generation of the Idq drift is expressed more precisely.

The equation (4) indicates that as the level of the input signal $x[n]$ increases, the Idq drift is more likely to be generated, and the first parameter $R[n+1]$ increases. Additionally, the equation (4) indicates that as the level of the input signal $x[n]$ decreases, the Idq drift is less likely to be generated, and the first parameter $R[n+1]$ decreases.

In the equation (4), when it is assumed that the input signal $x[n]$ is zero, $R[n+1]=(I-A)R[n]$. In the equation (4), $-A$ represents the time constant of the recovery of the idle current Idq that has been decreased, and expresses that the idle current Idq recovers every certain time (the sampling interval T [sec]) when the input signal $x[n]$ is zero. The value of each element of the matrix A is sufficiently small (for example, approximately 1/1000 to 1/1000000). Setting the value of each element in the matrix A to be sufficiently small causes (I−A) by which $R[n]$ is to be multiplied to be nearly identical to the unit matrix, and the degree of decrease from $R[n]$ to $R[n+1]$ becomes small. That is, setting the value of each element in the matrix A to be sufficiently small makes the change in the first parameter $R[n]$ gentle. As seen above, the parameter calculation model indicated by the equation (4) expresses the second memory effect having a long response time.

In the embodiment, the magnitude of each element in the matrix A is set to be sufficiently small so that the second memory effect expressed by the equation (4) has a longer response time than the first memory effect expressed by the equation (2) and the equation (3).

Here, A and B in the equation (4) are set according to the physical property and characteristic of the amplifier 10. When the physical property and the characteristic of the amplifier 10 have the temperature dependence, A and B are temperature dependent parameters that vary depending on the temperature condition of the amplifier 10. For example, the degree of ease of generation of the Idq drift varies depending on the temperature of the amplifier 10. The drift is more likely to be generated at lower temperature, while the drift is less likely to be generated at higher temperature.

In the equation (4), the parameter $R[n]$ is calculated using the temperature dependent parameters A and B. The temperature dependent parameters A and B are variable, and the values thereof are adjusted by a temperature dependent parameter adjuster 310. The temperature dependent parameter adjuster 310 adjusts the temperature dependent parameters A and B according to the temperature condition provided as simulation data. In the embodiment, the combination ratio is calculated using the temperature dependent parameters A and B. Thus, the combination ratio is affected by the temperature condition.

In FIG. 9, the equation (5) converts the first parameter R[n] indicating the state of the Idq drift to the second parameter α[n] having a value within the range of 0 or greater and 1 or less. In the equation (5), F(·) is a normalization function, and normalizes the first parameter R[n] into the range of 0 or greater and 1 or less. The second parameter α[n] is also a parameter indicating the internal state.

The normalization function F(·) is appropriately set so that α[n] becomes closer to 0 as the value of the first parameter R[n] is larger (as the Idq drift is generated more), and α[n] becomes closer to 1 as the value of the first parameter R[n] is smaller (as the Idq drift is generated less).

The state of generation of the Idq drift can be expressed as follows using the internal state. The state where no Idq drift is generated obtained when the state where the level of the input signal input to the amplifier is zero continues for a sufficiently long time is defined as an initial internal state. As the input signal level increases, the internal state varies from the initial internal state more largely. That is, the difference between the internal state when the input signal level is a first level and the initial internal state is larger than the difference between the internal state when the input signal level is a second level smaller than the first level and the initial internal state. As the input signal level decreases, the internal state recovers to the initial internal state with time. That is, when the input signal level varies from the first level to the second level (e.g., 0 V) smaller than the first level, the internal state returns to the initial internal state with time.

As presented in FIG. 4, the variation from the initial internal state in the second internal state corresponding to the calculation model $G_2^{-1}$ is greater than the variation from the initial internal state in the first internal state corresponding to the calculation model $G_1^{-1}$. The combination ratio α is a combination ratio of the calculation model $G_1^{-1}$ to the sum of the calculation models $G_1^{-1}$ and $G_2^{-1}$. In the equation (4) in FIG. 9, n corresponds to a certain time (a first time), and n+1 corresponds to a time after the first time (a second time). In this case, in the equations (4) and (5), according to the first term of the equation (4), when the input signal level at n is zero, the combination ratio α at n+1 (a second combination ratio) is smaller than the combination ratio α at n (a first combination ratio). Additionally, according to the second term of the equation (4), the combination ratio α at n+1 when the input signal level at n is the first level is larger than the combination ratio α at n+1 when the input signal level at n is the second level smaller than the first level. Thus, it becomes possible to model the distortion compensation characteristic for compensating for the non-linear characteristic (the distortion characteristic) of the amplifier having Idq drift.

Furthermore, as presented in the equation (4), the combination ratio α at n+1 is the sum of a first term, which is smaller than the combination ratio α at n, and a second term, which increases as the input signal level increases. Thus, it becomes possible to model the distortion compensation model for compensating for the non-linear characteristic (the distortion characteristic) of the amplifier having Idq drift.

Second Embodiment

Figure 10:
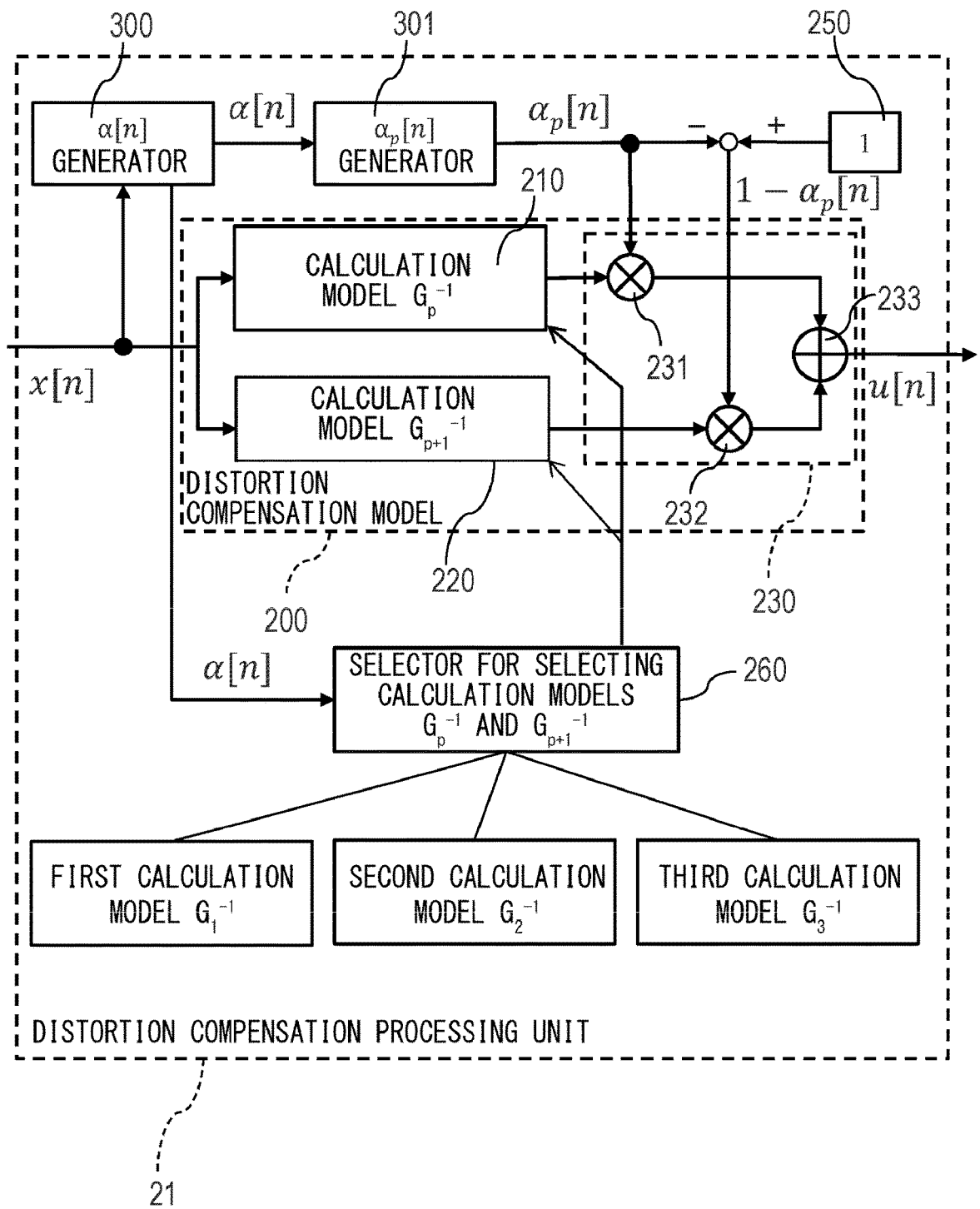
FIG. 10 is a block diagram of a distortion compensation device in accordance with a second embodiment.

FIG. 10 illustrates the distortion compensation processing unit 21 of the distortion compensation device 20 in accordance with the second embodiment. The configurations not particularly described in the second embodiment are the same as those of the first embodiment.

There may be a case that the sufficient expression precision is not obtained using two models. Thus, depending on the state of generation of the Idq drift, use of three or more calculation models allows the characteristics of the amplifier 10 to be expressed more appropriately. Thus, in the second embodiment, as an example, a coupled model obtained by combining the adjoining two calculation models among three calculation models corresponding to three internal states is used as the distortion compensation model 200.

The distortion compensation device 20 in accordance with the second embodiment includes a selector 260 for selecting the calculation models to be selected. The distortion compensation device 20 according to the second embodiment includes three calculation models $G_1^{-1}$, $G_2^{-1}$, and $G_3^{-1}$. That is, the distortion compensation model 200 has a first calculation model $G_1^{-1}$, a second calculation model $G_2^{-1}$, and a third calculation model $G_3^{-1}$. The distortion compensation device 20 may include four or more calculation models. In the second embodiment, the distortion compensation characteristic $G^{-1}$ in the distortion compensation model 200 is represented as the composite characteristic of the calculation models selected from the calculation models $G_1^{-1}$, $G_2^{-1}$, and $G_3^{-1}$.

In the second embodiment, the selector 260 selects two calculation models $G_p^{-1}$ and $G_{p+1}^{-1}$ to be combined, from a plurality of the calculation models $G_1^{-1}$, $G_2^{-1}$, and $G_3^{-1}$. The number of the calculation models to be selected is not limited to two, and three or more calculation models may be selected from four or more calculation models.

The calculation for the selected calculation model $G_p^{-1}$ is performed by the first arithmetic unit 210. The first arithmetic unit 210 applies the calculation model $G_p^{-1}$ to the input signal x[n], and outputs the calculation result $G_p^{-1}$ (x[·]). The calculation for the selected calculation model $G_{p+1}^{-1}$ is performed by the second arithmetic unit 220. The second arithmetic unit 220 applies the calculation model $G_{p+1}^{-1}$ to the input signal x[n], and outputs the calculation result $G_{p+1}^{-1}$ (x[·]).

The combiner 230 obtains the composite characteristic obtained by combining the selected calculation models $G_p^{-1}$ and $G_{p+1}^{-1}$ at a combination ratio that dynamically varies. The composite characteristic of the selected calculation models $G_p^{-1}$ and $G_{p+1}^{-1}$ is the distortion compensation characteristic $G^{-1}$ of the distortion compensation model 200. The distortion compensation model 200 in the second embodiment is represented by the equation (7) in FIG. 11. The combination ratio $α_p$ [n]:(1−$α_p$ [n]) in the equation (7) will be described later.

In the embodiment, the combiner 230 combines the calculation result $G_p^{-1}$ (x[·]) of the first arithmetic unit 210 and the calculation result $G_{p+1}^{-1}$ (x[·]) of the second arithmetic unit 220 at the varying combination ratio. A composite function may be obtained by combining the coefficients of the functions constituting the selected calculation models $G_p^{-1}$ and $G_{p+1}^{-1}$ according to the combination ratio in advance, and the obtained composite function may be applied to the input signal x[n].

The calculation models $G_1^{-1}$, $G_2^{-1}$, and $G_3^{-1}$ have distortion compensation characteristics for the amplifier 10 in different internal states, respectively. More specifically, the first calculation model $G_1^{-1}$ has a first distortion compensation characteristic for the amplifier 10 in the first internal state. The second calculation model $G_2^{-1}$ has a second distortion compensation characteristic of the amplifier 10 in the second internal state. The third calculation model $G_3^{-1}$ has a third distortion compensation characteristic for the amplifier 10 in the third internal state.

Figure 12:
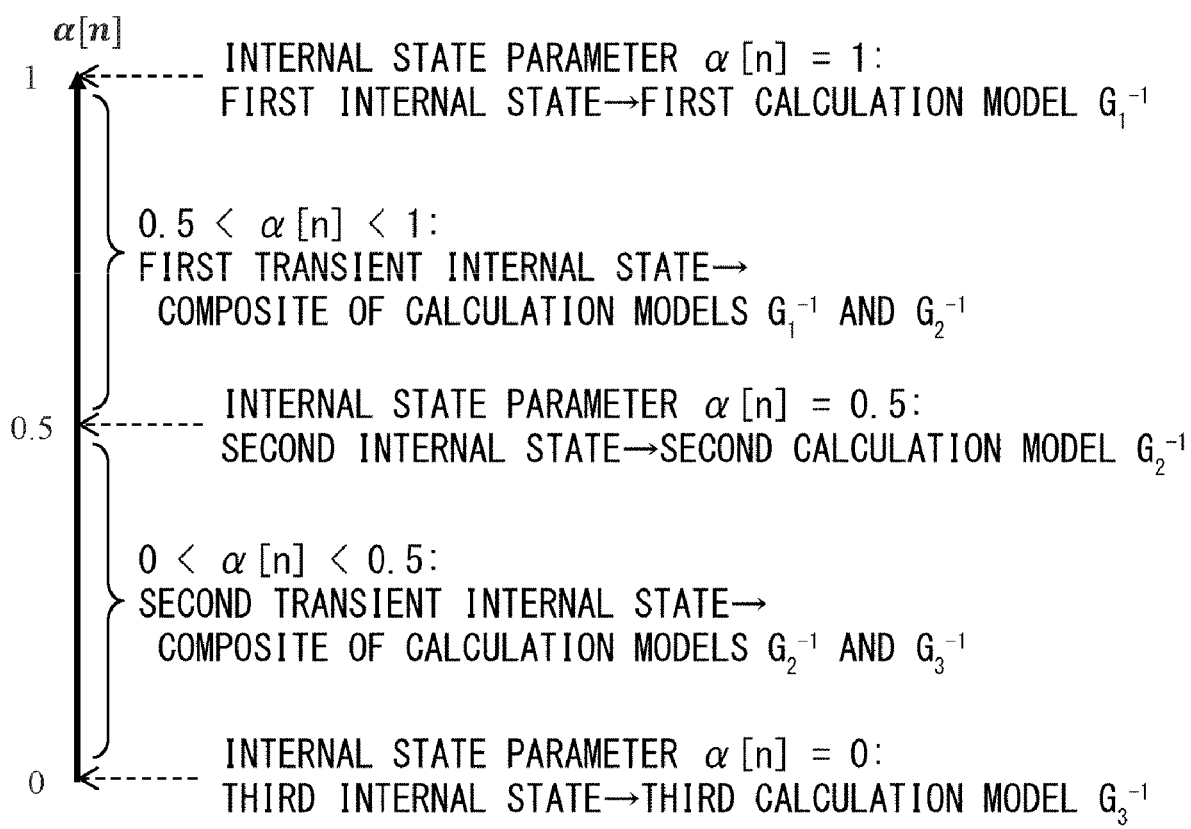
FIG. 12 illustrates a relation between the internal state parameter and the calculation model.

As illustrated in FIG. 12, the first internal state, the second internal state, and the third internal state are different states. The first internal state corresponding to the first calculation model $G_1^{-1}$ is a state where the Idq drift is generated least in the amplifier 10. The first internal state corresponds to the internal state parameter $\alpha[n]=1$. The third internal state corresponding to the third calculation model $G_3^{-1}$ is a state where the Idq drift is generated most in the amplifier 10. The third internal state corresponds to the internal state parameter $\alpha[n]=0$.

The second internal state corresponding to the second calculation model $G_2^{-1}$ is an intermediate internal state between the first internal state and the third internal state. In FIG. 12, the second internal state corresponds to the internal state parameter $\alpha[n]=0.5$. In the second internal state, the state of generation of the Idq drift is between that in the first internal state and that in the third internal state. The model can be expressed more precisely by increasing the number of internal states corresponding to the calculation models to three or more.

The selector 260 selects the calculation models $G^{-1}$ and $G_{p+1}^{-1}$ to be combined according to the internal state of the amplifier 10. More specifically, as illustrated in FIG. 11 and FIG. 12, in the case of 0.5 $(=\beta_2)<\alpha[n]\leq 1$ (=(in the case of p=1), the first calculation model $G_1^{-1}$ and the second calculation model $G_2^{-1}$ are selected as the calculation models to be combined. In this case, the distortion compensation model 200 has the composite characteristic of the first calculation model $G_1^{-1}$ and the second calculation model $G_2^{-1}$, and the composite characteristic is represented by the equation (7-1) in FIG. 11. Additionally, the combination ratio for the first calculation model $G_1^{-1}$ is $\alpha_1[n]$, and the combination ratio for the second calculation model $G_2^{-1}$ is $(1-\alpha_1[n])$. Here, $\alpha_1[n]$ is determined according to the equation (8-1) in FIG. 11.

The composite characteristic represented by the equation (7-1) can represent the distortion compensation characteristic for the amplifier 10 in an arbitrary first transient internal state between the first internal state and the second internal state ($0.5<\alpha[n]<1$). In the second embodiment, the distortion compensation characteristic for the amplifier 10 in the first transient internal state ($0.5<\alpha[n]<1$) is more appropriately expressed than in the first embodiment.

In the case of 0 $(=\beta_3)\leq\alpha[n]\leq 0.5$ $(=\beta_2)$ (in the case of p=2), the second calculation model $G_2^{-1}$ and the third calculation model $G_3^{-1}$ are selected as the calculation models to be combined. In this case, the distortion compensation model 200 has the composite characteristic of the second calculation model $G_2^{-1}$ and the third calculation model $G_3^{-1}$, and the composite characteristic is represented by the equation (7-2) in FIG. 11. Additionally, the combination ratio for the second calculation model $G_2^{-1}$ is $\alpha_2[n]$, and the combination ratio for the third calculation model $G_3^{-1}$ is $(1-\alpha_2[n])$. Here, $\alpha_2[n]$ is determined according to the equation (8-2).

The composite characteristic represented by the equation (7-2) can represent the distortion compensation characteristic for the amplifier 10 in the second transient internal state between the second internal state and the third internal state ($0<\alpha[n]<0.5$). In the second embodiment, the distortion compensation characteristic for the amplifier 10 in the second transient internal state ($0<\alpha[n]<0.5$) can be appropriately expressed than in the first embodiment.

Figure 13:
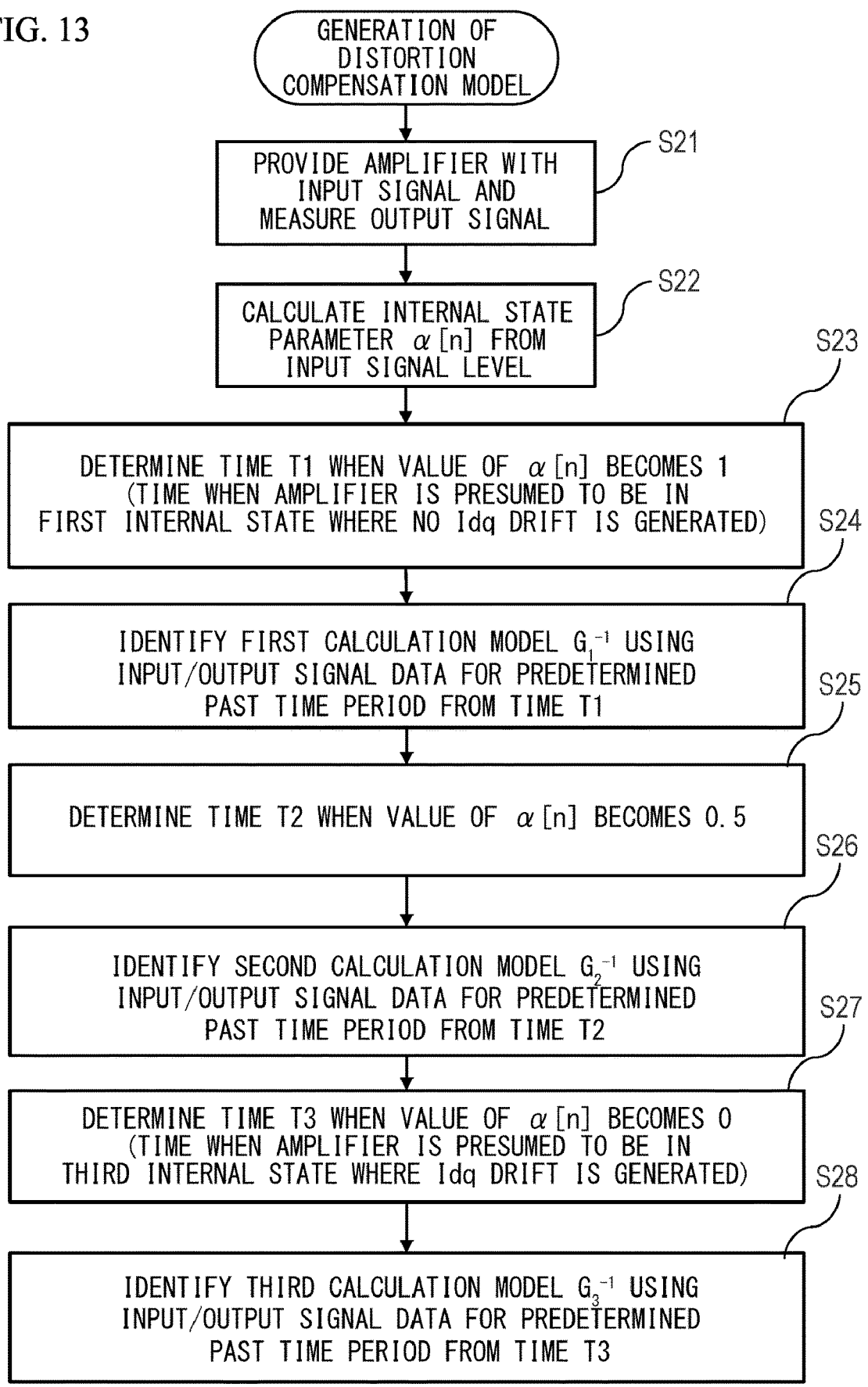
FIG. 13 is a flowchart of a process of generating the amplifier model.

FIG. 13 illustrates a process of generating the calculation models $G_1^{-1}$, $G_2^{-1}$, and $G_3^{-1}$. First, the input signal is provided to the amplifier 10, and the output signal is measured (step S21).

In step S22, the internal state parameter $\alpha[n]$ is calculated from the level of the input signal provided to the amplifier 10. The internal state parameter $\alpha[n]$ is calculated based on the level of the input signal u[n] by the $\alpha[n]$ generator 300.

In step S23, the time T1 when the value of $\alpha[n]$ becomes 1 is determined. The time T1 is the time when the amplifier 10 is presumed to be in the first internal state where the Idq drift is generated least.

In step S24, the coefficient of the first calculation model $G_1^{-1}$ is identified from the data of the input signal and the output signal for a predetermined past time period from the time T1. Through this process, the first calculation model $G_1^{-1}$ is obtained.

In step S25, the time T2 when the value of $\alpha[n]$ becomes 0.5 is determined. The time T2 is the time when the amplifier 10 is presumed to be in the second internal state that is an intermediate internal state.

In step S26, the coefficient of the second calculation model $G_2^{-1}$ is identified from the data of the input signal and the output signal for a predetermined past time period from the time T2. Through this process, the second calculation model $G_2^{-1}$ is obtained.

In step S27, the time T3 when the value of $\alpha[n]$ becomes 0 is determined. The time T3 is the time when the amplifier 10 is presumed to be in the third internal state where the Idq drift is generated most.

In step S28, the coefficient of the third calculation model $G_3^{-1}$ is identified from data of the input signal and the output signal for a predetermined past time period from the time T3. Through this process, the third calculation model $G_3^{-1}$ is obtained.

As illustrated in FIG. 10, the distortion compensation device 20 of the second embodiment includes a generator 301 that generates, from the parameter $\alpha[n]$ indicating the internal state, the parameter $\alpha_p[n]$ for determining the combination ratio. The generator 301 obtains $\alpha[n]$ from the generator 300, and outputs $\alpha_p[n]$.

Figure 14:
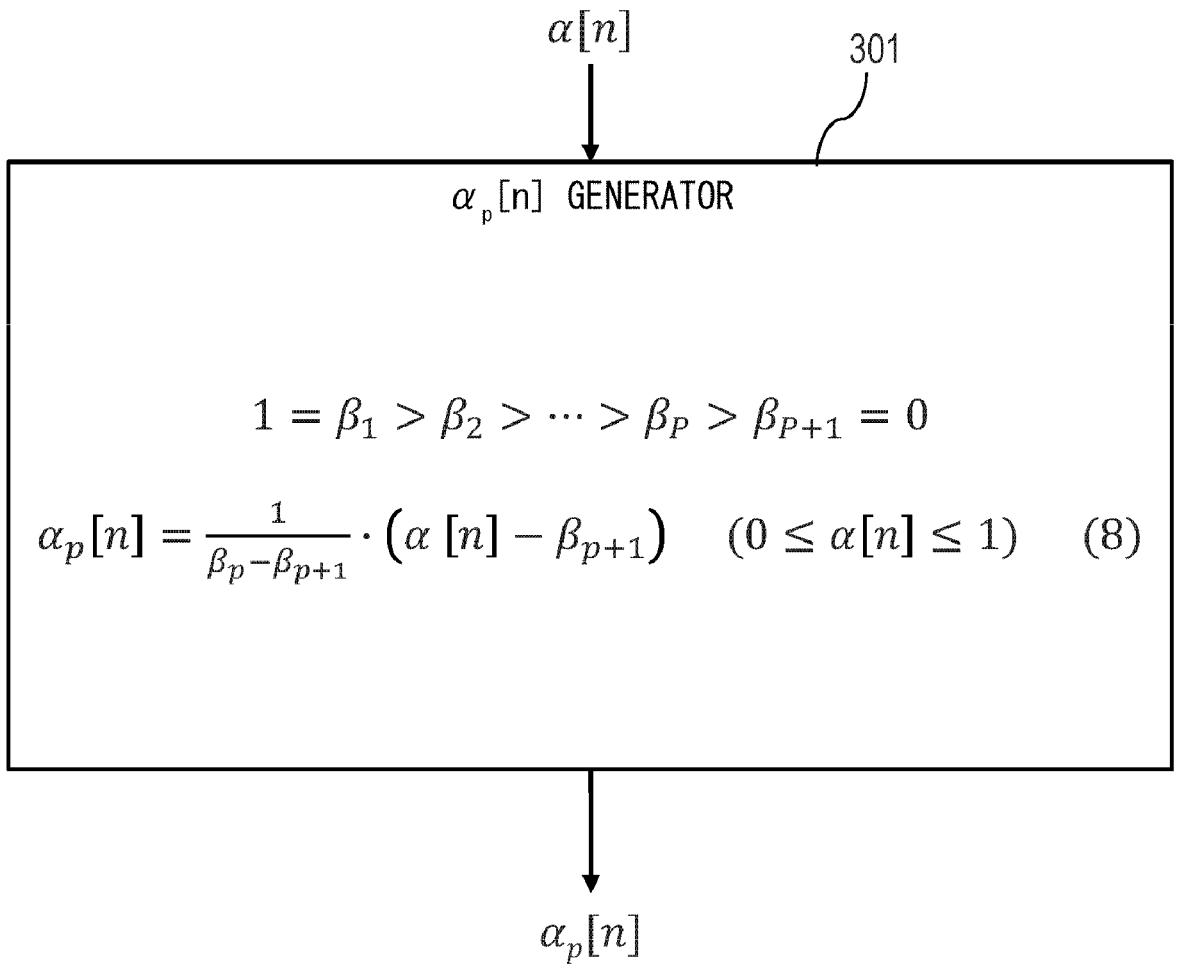
FIG. 14 is an explanatory diagram of an $\alpha_P[n]$ generator.

As illustrated in FIG. 14, the generator 301 calculates the parameter $\alpha_p[n]$ from the parameter $\alpha[n]$ according to the equation (8) in FIG. 14. The generator 301 normalizes $\alpha[n]$ having a value within a range of $\beta_p \geq \alpha[n] \geq \beta_{p+1}$) into a value within a range of $0<=\alpha_p[n]<=1$. The equation (8) becomes the equation (8-1) in FIG. 11 in the case of 0.5 $(=\beta_2)<\alpha[n]$ 1 $(=\beta_1)$ (in the case of p=1), and the equation (8) becomes the equation (8-2) in FIG. 11 in the case of $0(=\beta_3)\leq\alpha[n]\leq 0.5$ $(=\beta_2)$ (in the case of p=2).

Although the embodiments of the present invention have been described in detail, it is to be understood that the various change, substitutions, and alterations could be made hereto without departing from the spirit and scope of the invention.

What is claimed is:

1. A distortion compensation device using a distortion compensation model to perform distortion compensation on a signal to be amplified by an amplifier having a varying internal state that affects a distortion characteristic of the amplifier, the internal state varying among an initial internal state, a first internal state, and a second internal state different from the first internal state, wherein variation of the internal state from the initial internal state to the second internal state is larger than variation from the initial internal state to the first internal state, and wherein the internal state varies from the initial internal state as a level of a signal input to the amplifier increases and recovers to the initial internal state in time as the level of the input signal decreases, and wherein the distortion compensation model includes:

a plurality of calculation models having respective distortion compensation characteristics for the amplifier in the different internal states of the amplifier, and a combiner combining the plurality of calculation models at combination ratios corresponding to the internal states of the amplifier, wherein:

the plurality of calculation models includes:

a first calculation model having a first distortion compensation characteristic for the first internal state;

a second calculation model having a second distortion compensation characteristic for the second internal state, and the combination rations include:

a first combination ratio that is a ratio of the first calculation model to a sum of the first calculation model and the second calculation model at a first time, and a second combination ratio that is a ratio of the first calculation model to the sum of the first calculation model and the second calculation model at a second time after the first time, and wherein the second combination ratio is smaller than the first combination ratio when the level of the input signal at the first time is zero, and the second combination ratio is larger when the level of the input signal at the first time is at a first level than when the level of the input signal at the first time is a second level, the second level being smaller than the first level.

2. The distortion compensation device according to claim 1, wherein the first combination ratio and the second combination ratio are calculated using a temperature dependent parameter that varies depending on a temperature condition.

3. The distortion compensation device according to claim 1, wherein the second combination ratio is a sum of a first term and a second term, the first term being smaller than the first combination ratio, and the second term increasing as the level of the input signal at the first time increases.

4. A distortion compensation method for performing distortion compensation on a signal to be amplified by an amplifier having a varying internal state affecting a distortion characteristic, the internal state varying among an initial internal state, a first internal state, and a second internal state different from the first internal state, wherein variation of the internal state from the initial internal state to the second internal state is larger than variation from the initial internal state to the first internal state, and wherein the internal state varies from the initial internal state as a level of a signal input to the amplifier increases and recovers to the initial internal state in time as the level of the input signal decreases, the distortion compensation method comprising:

a step in which a distortion compensation device combines a plurality of calculation models having respective distortion compensation characteristics for the amplifier in different internal states at combination ratios corresponding to the internal states, wherein:

the plurality of calculation models includes:

a first calculation model having a first distortion compensation characteristic for the amplifier in a first internal state;

a second calculation model having a second distortion compensation characteristic for the amplifier in a second internal state different from the first internal state, and the combination ratios include:

a first combination ratio that is a combination ratio of the first calculation model to a sum of the first calculation model and the second calculation model at a first time, and a second combination ratio that is a combination ratio of the first calculation model to the sum of the first calculation model and the second calculation model at a second time after the first time, and wherein the second combination ratio is smaller than the first combination ratio when the level of the input signal at the first time is zero, and the second combination ratio is larger when the level of the input signal at the first time is at a first level than when the level of the input signal at the first time is a second level, the second level being smaller than the first level.

5. A non-transitory computer-readable storage medium storing a computer program for distortion compensation on a signal to be amplified by an amplifier having a varying internal state affecting a distortion characteristic, the internal state varying among an initial internal state, a first internal state, and a second internal state different from the first internal state, wherein variation of the internal state from the initial internal state to the second internal state is larger than variation from the initial internal state to the first internal state, and wherein the internal state varies from the initial internal state as a level of a signal input to the amplifier increases and recovers to the initial internal state in time as the level of the input signal decreases, the computer program causing a computer to execute a process, the process comprising:

combining a plurality of calculation models having respective distortion compensation characteristics for the amplifier in different internal states at combination ratios corresponding to the internal states, wherein:

the plurality of calculation models includes:

a first calculation model having a first distortion compensation characteristic for the amplifier in a first internal state;

a second calculation model having a second distortion compensation characteristic for the amplifier in a second internal state different from the first internal state, the combination ratios include:

a first combination ratio is a combination ratio of the first calculation model to a sum of the first calculation model and the second calculation model at a first time, a second combination ratio is a combination ratio of the first calculation model to the sum of the first calculation model and the second calculation model at a second time after the first time, and wherein the second combination ratio is smaller than the first combination ratio when the level of the input signal at the first time is zero, and the second combination ratio is larger when the level of the input signal at the first time is at a first level than when the level of the input signal at the first time is a second level, the second level being smaller than the first level.

6. The distortion compensation method according to claim 4, wherein the second combination ratio is a sum of a first term and a second term, the first term being smaller than the first combination ratio, and the second term increasing as the level of the input signal at the first time increases.

7. The non-transitory computer-readable storage medium according to claim 5, wherein the second combination ratio is a sum of a first term and a second term, the first term being smaller than the first combination ratio, and the second term increasing as the level of the input signal at the first time increases.

\* \* \* \* \*